(12) United States Patent
Iwamoto

(10) Patent No.: US 6,452,849 B1
(45) Date of Patent: Sep. 17, 2002

(54) SEMICONDUCTOR DEVICE WITH TEST MODE FOR PERFORMING EFFICIENT CALIBRATION OF MEASURING APPARATUS

(75) Inventor: Hisashi Iwamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,650

(22) Filed: Oct. 25, 2001

(30) Foreign Application Priority Data

May 30, 2001 (JP) ........................................ 2001-162754

(51) Int. Cl.[7] .............................................. G11C 29/00
(52) U.S. Cl. ...................................... 365/201; 365/233
(58) Field of Search .............................. 365/201, 233, 365/189.07, 194

(56) References Cited

U.S. PATENT DOCUMENTS 6,108,793 A * 8/2000 Fujii ........................... 713/400

6,351,169 B2 * 2/2002 Kuge ........................... 327/161

FOREIGN PATENT DOCUMENTS

| JP | 2000-200482 | 7/2000 |
| JP | 2000-306399 | * 11/2000 |

* cited by examiner

Primary Examiner—Son Mai
(74) Attorney, Agent, or Firm—McDermott, Will & Emery

(57) ABSTRACT

A clock buffer includes: a comparator circuit comparing complementary clock signals CLK and /CLK with each other to output an internal clock signal used in a normal operation; a comparator circuit comparing a reference potential Vref and clock signal CLK with each other; and a comparator circuit comparing reference potential Vref and clock signal /CLK with each other. A phase comparator circuit compares the complementary clock signals with each other in respect to phase. An input/output buffer outputs an output of the phase comparator circuit to a data output terminal in a test mode. Therefore, there can be realized a test mode for performing efficient calibration of a measuring apparatus.

11 Claims, 15 Drawing Sheets

SEMICONDUCTOR DEVICE WITH TEST MODE FOR PERFORMING EFFICIENT CALIBRATION OF MEASURING APPARATUS

BACKGROUND OF THE INVENTION

1. Field of the Invention

The present invention relates to a semiconductor device, and particularly to a synchronous semiconductor memory device capturing an external signal in synchronism with a clock signal given periodically from outside the device. More particularly, the present invention relates to a test mode circuit in a synchronous dynamic random access memory (hereinafter referred to as SDRAN) using a data strobe signal (DQS) for capturing data.

2. Description of the Background Art

Although a dynamic random access memory (DRAM) used as a main memory has acquired a high speed in operation, but still, its operating speed cannot catch up an operating speed of a microprocessor (MPU). For this reason, it has been often said that an access time and a cycle time of a DRAM become bottlenecks, thereby reducing performance of all the system. In recent years, there has been proposed a double data rate SDRAM (DDR SDRAM) operating in synchronism with a clock signal as a main memory for a high speed MPU.

As a higher speed operation becomes possible, a test for confirming operation of a semiconductor memory device is harder to perform.

FIG. 20 is a diagram for describing a test for confirming functions of a semiconductor memory device.

Referring to FIG. 20, a semiconductor memory device 712 is confirmed on its operation by a tester 700. Tester 700 includes: a timing generator 702; a signal generator 704 generating an input signal to semiconductor memory device 712 according to an output of timing generator 702; and a driver 706 driving an input node of semiconductor memory device 712 according to an output of signal generator 704. Driver 706 gives semiconductor memory device 712 complementary clock signals extCLK and ext/CLK, control signals /RAS and /CAS, complementary strobe signals DQS and /DQS, and a data input signal DIN.

Semiconductor memory device 712 outputs a data output signal QOUT according to a signal given from tester 700.

Tester 700 includes: a comparator 710 performing a level determination on a signal outputted from the semiconductor memory device 712 with a predetermined threshold value; and a determination section 708 performing determination by comparing an output from comparator 710 with an expected value pattern at a timing given from timing generator 702.

FIG. 21 is an operating waveform diagram for describing input and output waveforms in a standardized operation of DDR SDRAM.

In FIG. 21, there is shown a write or read operation for consecutive 4 data (a total of 32 bits of 8×4) in an SDRAM capable of inputting and outputting of 8 bit data (byte data) at data input/output terminals DQ0 to DQ7. The number of bits of data read out consecutively is referred to a burst length and the burst length can be usually changed by setting of a mode register in a DDR SDRAM.

Referring to FIG. 21, at a time point t1, control signals from the outside (a row address strobe signal /RAS, a column address strobe signal /CAS, an address signal Add. and so on) are captured at a rise edge of the clock signal extCLK. Since row address strobe signal /RAS is at L level in an active state, address signal Add. at this time is captured as a row address Xa. Note that address signal Add. includes address signals A0 to A10 and a bank address signal BA.

At a time point t2, the column address strobe signal /CAS goes to L level in an active state and captured into the interior of the DDR SDRAM in synchronism with a rise of clock signal ext.CLK. Address signal Add at this time is captured as a column address Yb. A column or row select operation is performed in DDR SDRAM according to row address Xa and column address Yb captured.

D/Q shows data signals DQ0 to DQi inputted and outputted from an input/output terminal. After predetermined clock cycles (in FIG. 21, 3.5 clock cycles) passes away from a fall of row strobe address /RAS to L level, first data q0 is outputted at a time point t4 and data q1 to data q3 are consecutively outputted, following data q0.

Outputting the data q0 to q3 is performed in response to a crossing point between clock signal extCLK and clock signal ext/CLK. In order to enable high speed data transfer, data strobe signal DQS is outputted in phase with output data.

Note that at a rise edge of clock signal extCLK, which is a time point t3, control signals /RAS and /WE are set to L level and rewrite (precharge) to a memory cell is performed.

Signal waveforms at a time point t5 or later show a write operation. At time point t5, row address Xc is captured. At a time point t6, column address strobe signal /CAS and write enable signal /WE are both set to L level in an active state and at the time, column address Yd is captured at a rise edge of clock signal extCLK. Data d0 having been given at the time is captured as first write data. In response to falls of row address strobe signal /RAS and column address strobe signal /CAS, row and column select operations are performed inside DDR SDRAM. Hereinafter, input data dl to d3 are sequentially captured in synchronism with data strobe signal DQS and written into respective corresponding memory cells.

As an operating speed of a semiconductor device increases, the accuracy of a tester in test on confirmation of its operation becomes problematic. In tester 700 described in FIG. 20, calibration is performed in order to keep a state of the tester constant. For example, this is because, if shifts in timing exist between plural control signals given to a semiconductor memory device from the tester, an inspection yield decreases.

Generally speaking, testers used in mass production or the like are each operated on many of devices simultaneously. Such a tester performing simultaneous measurement on many devices suffers from its lowered accuracy due to large numbers of driver pins and comparator pins. Contrary to this, most of testers for use in evaluation of a device in the development stage, where a small number of devices can be simultaneously measured therewith, have good accuracy due to the small number of measured devices. Therefore, it is conceived that a device with known characteristics having been measured by a high accuracy tester is used for calibration of a tester for mass production operative on simultaneous measurement of many of devices. That is, in this case, a standard device having known measurements is used and adjustments on a low accuracy tester are performed so as to output the same value as from the standard device.

For example, in a case of DDR SDRAM, data signal DQ is captured with data strobe signal DQS. Therefore, a set-up time and a hold time of data, which has been measured with a high accuracy tester, are measured by the low accuracy tester and phase matching on the low accuracy tester is performed. Then, a difference in output timing between a driver of a tester outputting data strobe signal DQS and a driver of a tester outputting data signal DQ can be narrowed.

However, there exist items that cannot be matched only by adjustments on device characteristics.

FIG. 22 is an operating waveform diagram showing relationships among clock signals CLK and /CLK, data strobe signals DQS and /DQS and data signal DQ in an ideal case.

Referring to FIG. 22, clock signal CLK and clock signal /CLK are crossed at a point of just a half amplitude of the waveforms. This applies to a relationship between data strobe signal DQS and data strobe signal /DQS in a similar manner.

FIG. 23 is an operating waveform diagram for describing a case where there arises a shift between waveforms of complementary signals.

Referring to FIG. 23, there is shown a case where clock signal /CLK lags behind clock signal CLK by some in respect to phase. Similar to this, data strobe signal /DQS lags behind data strobe signal DQS by some in respect to phase.

In a case where as shown in FIG. 23, clock signals CLK and /CLK are shifted from each other in respect to phase, the shift cannot be detected using a standard device whose characteristics have been measured. Similar to this, the shift between data strobe signals DQS and /DQS complementary to each other cannot also be detected. In this situation, calibration is performed in a state of phase shift, resulting in lowered measurement accuracy. If not so, different values than ones in real performance of a device are measured. That is, an error arises in measurement.

SUMMARY OF THE INVENTION

It is accordingly an object of the present invention to provide a semiconductor memory device with a test mode capable of performing efficient calibration of a measuring apparatus.

The present invention will be summarized this way: the present invention is directed to a semiconductor device with a normal mode and a test mode as operation modes, and including: an internal circuit; a phase comparator circuit; and an output buffer circuit.

The internal circuit operates according to first and second input signals in the normal mode. The phase comparator circuit compares the first and second input signals with each other in respect to phase in the test mode. The output buffer circuit outputs an output of the phase comparator circuit to outside the semiconductor device in the test mode.

According to another aspect of the present invention, the present invention is directed to a semiconductor device with a normal mode and a test mode as operation modes, including: a clock generator circuit and an input/output circuit.

The clock generator circuit outputs an internal clock signal according to an external clock signal. The clock generator circuit delays the external clock signal by a delay amount corresponding to a phase difference between the internal clock signal and the external clock signal to output the delayed external clock signal as the internal clock signal in the normal mode, while delaying the external clock signal by a fixed delay amount to output the delayed external signal as the internal clock in the test mode. The input/output circuit supplies and receives signals to and from outside the semiconductor device according to the internal clock signal.

Therefore, a main advantage of the present invention is in that since a result of comparison of two input signals with each other in respect to phase is outputted to outside the semiconductor device in the test mode, a tester can perform its own high accuracy calibration using the result of comparison.

Another advantage of the present invention is in that since a delay amount of a DLL circuit is fixed, a fluctuation in access time generated by the DLL circuit as a cause can be suppressed, thereby enabling calibration of a high accuracy tester.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the accompanying drawings, wherein the same symbols in the figures indicate the same or corresponding parts.

First Embodiment

Figure 1:
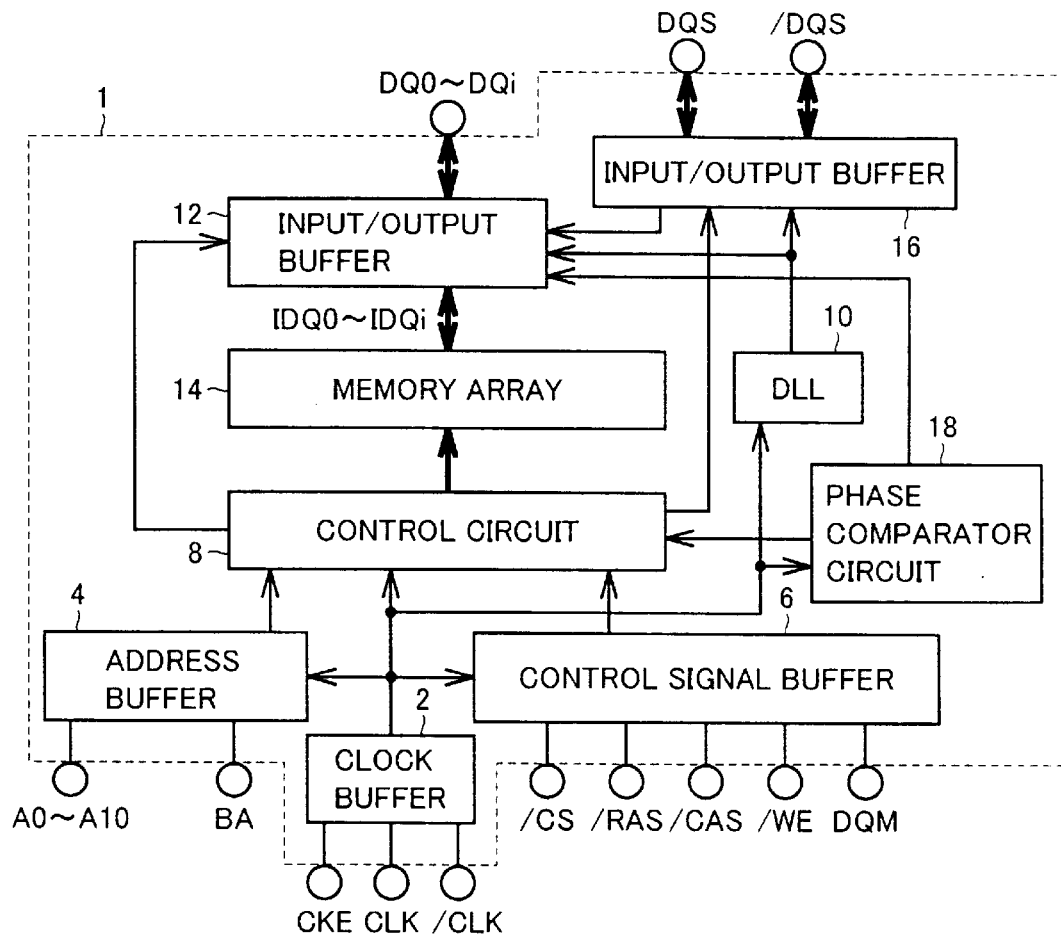
FIG. 1 is a block diagram showing a schematic configuration of a semiconductor device 1 of a first embodiment of the present invention.

FIG. 1 is a block diagram showing a schematic configuration of semiconductor device 1 of a first embodiment of the present invention.

Referring to FIG. 1, shown as an example of semiconductor device 1 is a double data rate synchronous dynamic random access memory (DDR SDRAM) performing supplying and receiving of data in synchronism with a clock signal.

Semiconductor device 1 includes: a clock buffer 2 receiving an external clock signals CLK and /CLK, a clock enable signal CKE; an address buffer 4 receiving address signals A0 to A10 and a bank address BA; and a control signal buffer 6 receiving control signals /CS, /RAS, /CAS, /WE and DQM. Address buffer 4 and control signal buffer 6 capture an address signal and a control signal in synchronism with an output of clock buffer 2.

Semiconductor device 1 further includes: an input/output buffer 16 inputting and outputting data strobe signals DQS and /DQS serving as reference in timing of supply and receiving of data; and a delay locked loop (DLL) circuit 10 generating an internal clock signal according to an output of clock buffer 2.

Semiconductor device 1 further includes: a control circuit 8 receiving outputs of address buffer 4 and control signal buffer 6 in synchronism with an output of clock buffer 2; a memory array 14 supplying and receiving internal data signals IDQ0 to IDQi under control of control circuit 8; and an input/output buffer 12 supplying and receiving data between outside semiconductor device 1 and memory array 14 in synchronism with an output of DLL circuit 10 or an output of input/output buffer 16.

Control circuit 8 includes a mode register, though not shown. The mode register, according to a mode register set command given in a combination of control signals, holds an operation mode specified by an address signal given at the time when the command is issued.

Semiconductor device 1 further includes: a phase comparator circuit 18 receiving complementary internal clock signals from clock buffer 2 to compare the signals therebetween and output a phase comparison result to outside semiconductor device 1 through input/output buffer 12 in a test mode.

Semiconductor device 1 can detect a phase difference between complementary clocks using the test mode. Detailed description will be given of the test mode using phase comparator circuit 18 below.

Figure 2:
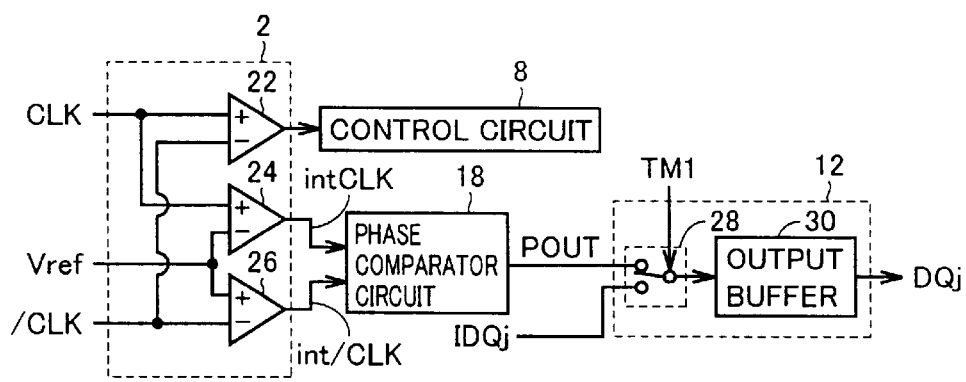
FIG. 2 is a diagram showing a configuration for detecting a phase difference between input signals of semiconductor device 1 shown in FIG. 1.

FIG. 2 is a diagram showing a configuration for detecting a phase difference between input signals of semiconductor device 1 shown in FIG. 1.

Referring to FIG. 2, clock buffer 2 includes: a comparator circuit 22 receiving clock signal CLK at the plus input node thereof and clock signal /CLK at the minus input node thereof; a comparator circuit 24 receiving clock signal CLK at the plus input node thereof and a reference potential Vref at the minus input node thereof to output an internal clock signal intCLK; and a comparator circuit 26 receiving reference potential Vref at the plus input node thereof and clock signal /CLK at the minus input node thereof to output an internal clock signal int/CLK.

Comparator circuit 22 gives control circuit 8 an internal clock used in a normal mode. On the other hand, comparator circuits 24 and 26 gives phase comparator circuit 18 phase comparison internal clocks intCLK and int/CLK for use in outputting a phase difference to outside semiconductor device 1 in the test mode.

Phase comparator circuit 18 receives internal clock signals intCLK and int/CLK to output an output signal POUT expressing a phase comparison result.

Input/output buffer 12 shown in FIG. 1 includes: a switch circuit 28 receiving internal data IDQj outputted from the memory array and output signal POUT to output the data or the signal; and an output buffer 30 receiving an output of switch circuit 28 to output data signal DQj to a terminal. Note that input/output buffer 12, though not shown, includes: an input buffer for transmitting a signal from a terminal to the memory array.

Switch circuit 28 outputs internal data signal IDQj to output buffer 30 in the normal mode in which a test mode signal TM1 is deactivated. On the other hand, switch circuit 28 outputs output signal POUT to output buffer 30 in the test mode in which test mode signal TM1 is activated.

Figure 3:
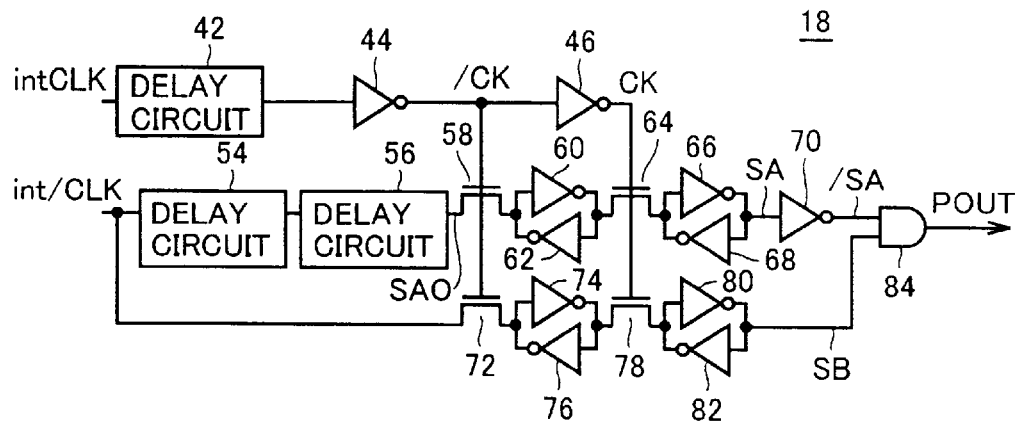
FIG. 3 is a circuit diagram showing a configuration of a phase comparator circuit 18 shown in FIG. 2.

FIG. 3 is a circuit diagram showing a configuration of phase comparator circuit 18 shown in FIG. 2.

Referring to FIG. 3, phase comparator circuit 18 includes: a delay circuit 42 receiving clock signal intCLK to delay it; an inverter 44 receiving and inverting an output of delay circuit 42 to output clock signal /CK; and an inverter 46 receiving and inverting clock signal /CK to output dock signal CK.

Phase comparator circuit 18 further includes: a delay circuit 54 receiving clock signal int/CLK to delay it; a delay circuit 56 receiving an output of delay circuit 54 to further delay it and output a signal SAO; an N channel MOS transistor 58 activated by clock signal /CK; an inverter 60 receiving and inverting signal SAO when N channel MOS transistor 58 is conducting; an inverter 62 receiving and inverting an output of inverter 60 to feed the inverted output back to the input of inverter 60; an N channel MOS transistor 64 activated by clock signal CK; an inverter 66 receiving and inverting an output of inverter 60 to output a signal SA when N channel MOS transistor 64 is conducting; an inverter 68 receiving and inverting signal SA to feed the inverted signal back to the input of inverter 66; and an inverter 70 receiving and inverting signal SA to output a signal /SA.

Phase comparator circuit 18 further includes: an N channel MOS transistor 72 activated according to clock signal /CK; an inverter 74 receiving and inverting clock signal int/CLK when N channel MOS transistor 72 is conducting; an inverter 76 receiving and inverting an output of inverter 74 to give the input of inverter 74 the inverted output; an N channel MOS transistor 78 becoming conductive according to clock signal CK; an inverter 80 receiving and inverting an output of inverter 74 to output a signal SB when N channel MOS transistor 78 is conducting; an inverter 82 receiving and inverting signal SB to give the input node of inverter 80 the inverted signal; and an AND circuit 84 receiving signals /SA and SB to output output signal POUT.

Figure 4:
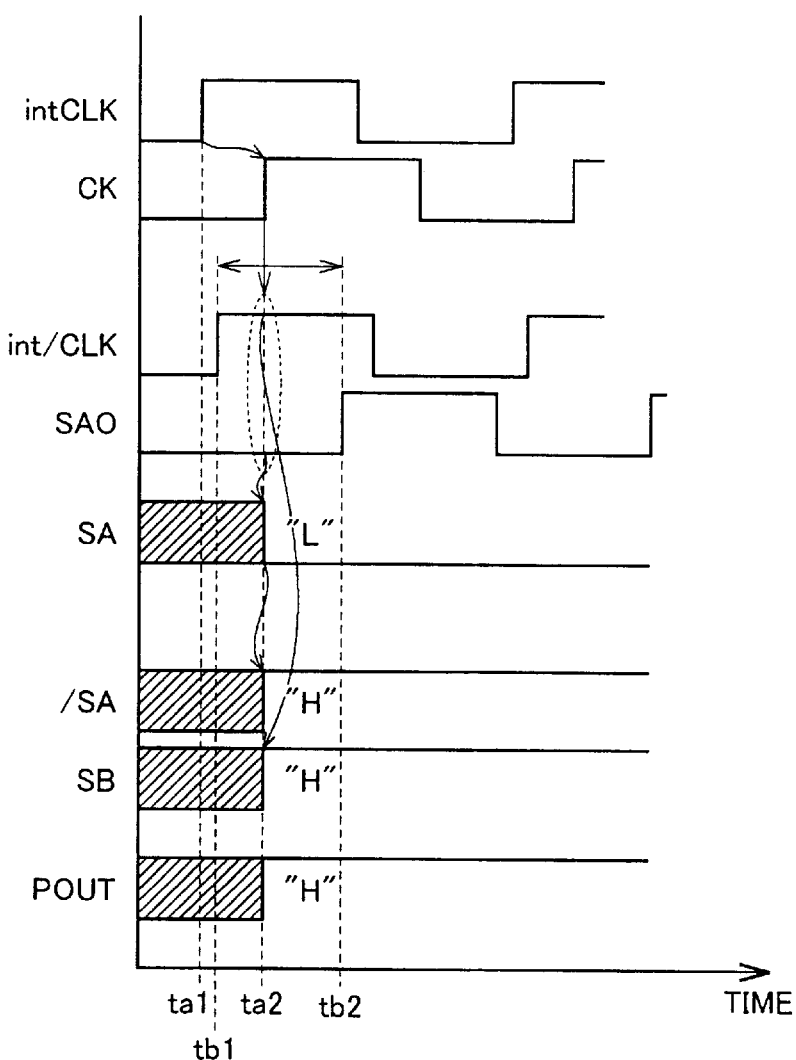
FIG. 4 is an operating waveform diagram for describing operation in a case where clock signals intCLK and int/CLK inputted to phase comparator circuit 18 shown in FIG. 3 are close to each other in respect to phase.

FIG. 4 is an operating waveform diagram for describing operation in a case where clock signals intCLK and int/CLK inputted to phase comparator circuit 18 shown in FIG. 3 are close to each other in respect to phase.

Referring to FIGS. 3 and 4, at a time point ta1, clock signal intCLK rises from L level to H level. At a time point ta2 later than time point ta1 by a delay time determined by delay circuit 42, clock signal CK rises from L level to H level.

A case is considered where at a time point tb 1 a little later than time point ta1, clock signal int/CLK rises from L level to H level. At a time point tb2 later than time point tb 1 by a delay time determined by delay circuits 54 and 56 combined, signal SAO rises from L level to H level.

In such a situation, a rise edge of clock signal int/CLK is located in the middle between time points ta1 and ta2. Furthermore, a rise edge of clock signal CK is located in the middle between time points tb1 and tb2.

Then, signal SA held by a latch constituted of inverters 66 and 68 goes to L level. On the other hand, signal SB held by a latch constituted of inverters 80 and 82 goes to H level. Since inverter 70 inverts signal SA into signal /SA and AND circuit 84 receives an output of inverter 70 and signal SB, output signal POUT goes to H level.

That is, when a rise edge of clock signal int/CLK is in a state close to a rise edge of clock signal intCLK, output signal POUT goes to H level.

Figure 5:
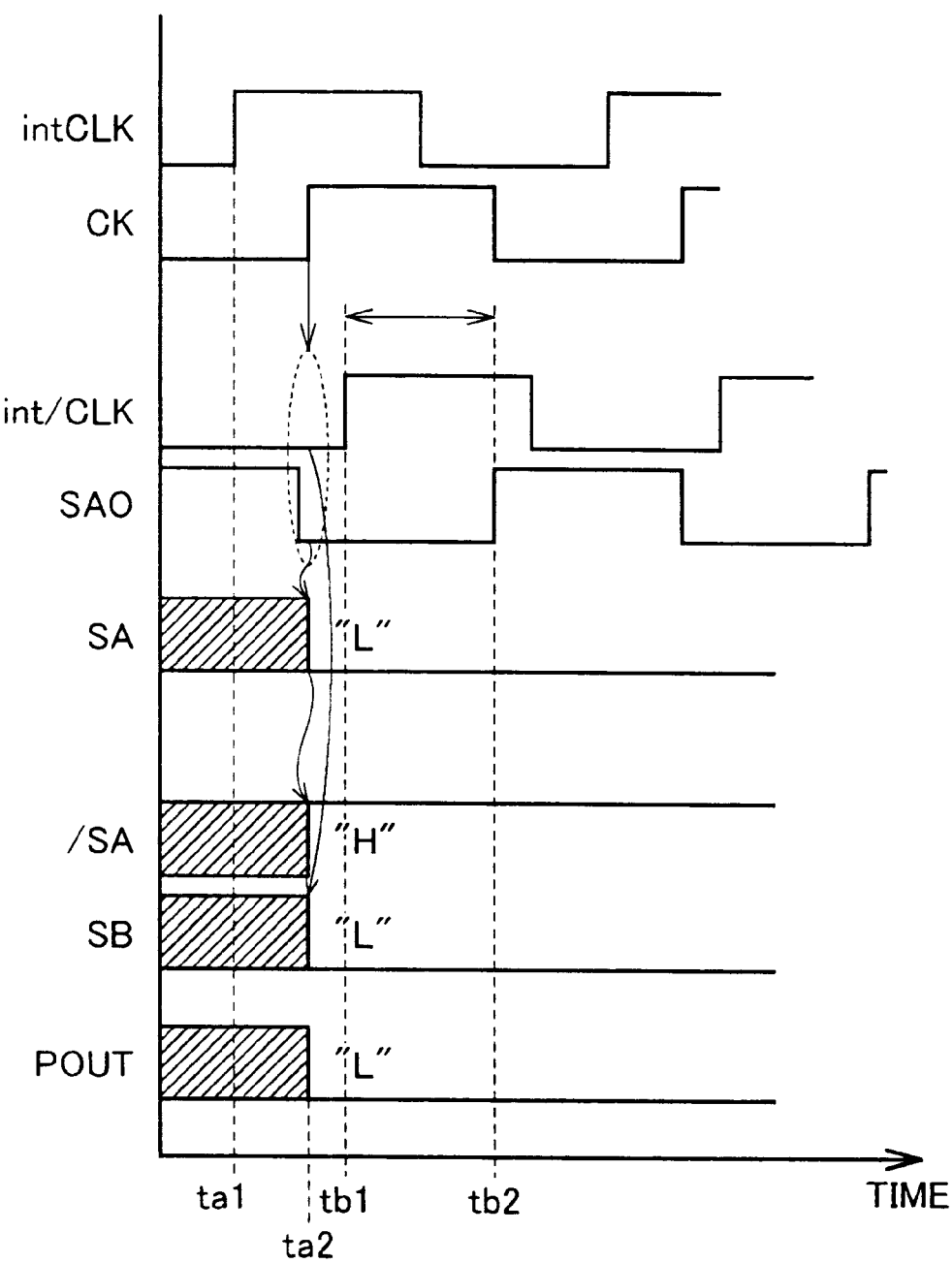
FIG. 5 is an operating waveform diagram for describing a case where clock signal int/CLK lags behind clock signal intCLK in respect to phase.

FIG. 5 is an operating waveform diagram for describing a case where clock signal int/CLK lags behind clock signal intCLK in respect to phase.

Referring to FIGS. 3 and 5, at time point ta1, clock signal intCLK rises from L level to H level. At time point ta2 later than time point ta1 by a delay time of delay circuit 42, clock signal CK rises from L level to H level. Since clock signal int/CLK lags in respect to phase behind a case shown in FIG. 4, clock signal int/CLK rises from L level to H level at time point tbl, corresponding to the lag in FIG. 5.

In this situation, signal SA goes to L level at time point ta2 and similar to this, signal SB is fixed at L level at time point ta2 as well. Then, since AND circuit 84 receives signal /SA of H level, which is an inverted signal of signal SA, and a signal SB of L level, output signal POUT goes to L level.

Figure 6:
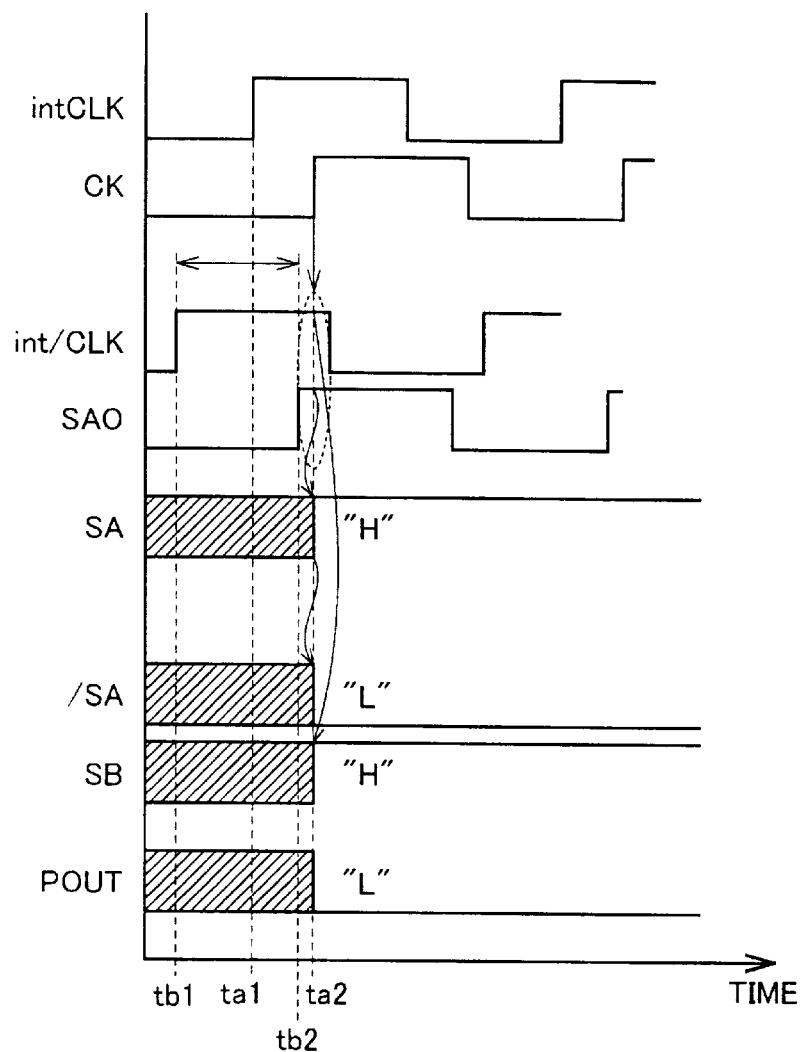
FIG. 6 is an operating waveform diagram for describing a case where signal int/CLK leads signal intCLK in respect to phase.

FIG. 6 is an operating waveform for describing a case where signal int/CLK leads signal intCLK in respect to phase.

Referring to FIGS. 3 and 6, at time point tbl, clock signal int/CLK first rises from L level to H level. Subsequent to this, at time point tal later than time point tb1, clock signal intCLK rises from L level to H level.

At time point tb2 later than time point tb1 by a delay time of delay circuits 54 and 56 combined, signal SAO rises from L level to H level. At time point ta2 a little later than time point tb2, clock signal CK rises from L level to H level.

In such a situation, signals SA and SB are both fixed at H level. Therefore, AND circuit 84 receiving signals /SA and SB outputs output signal POUT of L level.

As described above in FIGS. 4 to 6, phase comparator circuit 18 is configured such that when a phase difference between complementary clock signals inputted to the circuit 18 comes to fall within a delay time of delay circuit 42, output signal POUT of H level is outputted.

Figure 7:
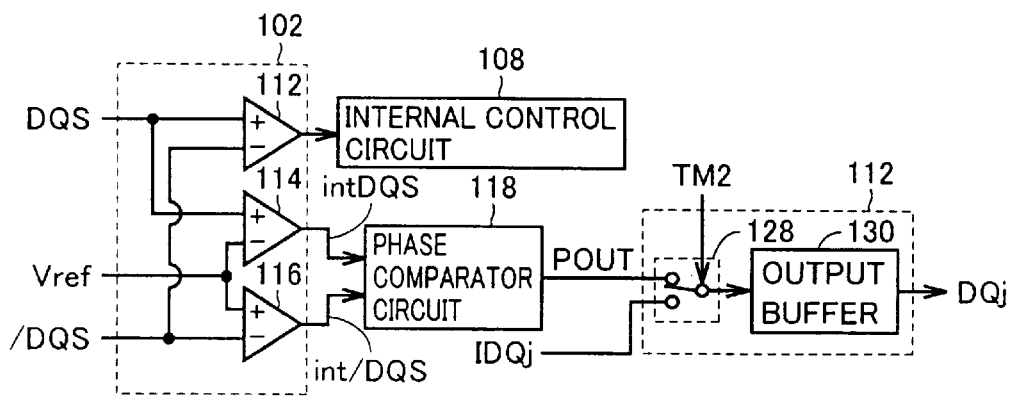
FIG. 7 is diagram showing a modification example in which the invention of the first embodiment is applied to data strobe signals DQS and /DQS.

FIG. 7 is diagram showing a modification example in which the invention of the first embodiment is applied to data strobe signals DQS and /DQS.

Referring to FIG. 7, an input buffer 102 includes: a comparator circuit 112 receiving strobe signal DQS at the plus input node thereof and strobe signal /DQS at the minus input node thereof to output an internal strobe signal used in the normal mode; a comparator circuit 114 receiving strobe signal DQS at the plus input node thereof and reference potential Vref at the minus input node to output an internal strobe signal intDQS; and a comparator circuit 116 receiving reference potential Vref at the plus input node thereof and strobe signal /DQS at the minus input node thereof to output an internal strobe signal int/DQS.

A phase comparator circuit 118 compares internal strobe signals intDQS and int/DQS with each other and outputs a result of the comparison as output POUT. Note that since a configuration of phase comparator circuit 118 is similar to that of phase comparator circuit 18 shown in FIG. 3, no description thereof is repeated.

Input/output buffer 112 includes: a switch circuit 128 outputting internal data signal IDQj outputted from the memory array or output signal POUT; and an output buffer 130 receiving an output of switch circuit 128 to output data signal DQj to a terminal. Switch circuit 128 outputs output signal POUT to output buffer 130 in the test mode in which a test mode signal TM2 is activated, while outputting internal data signal IDQj to output buffer 130 in the normal mode in which test mode signal TM2 is deactivated.

As described above, in the semiconductor device shown in the first embodiment, outputted from a terminal is information on whether or not complementary input signals are in phase with each other in the test mode. Therefore, a tester giving the semiconductor device a signal from outside the semiconductor device can perform timing adjustment on complementary signals while monitoring a result of phase comparison.

Second Embodiment

In the first embodiment, a tester can perform phase matching, monitoring a result of phase comparison outputted from the semiconductor device with gradual change in a phase difference. However, when a result of phase comparison is changed and outputted according to a magnitude of a phase difference, a time required for phase matching can be shorter.

Figure 8:
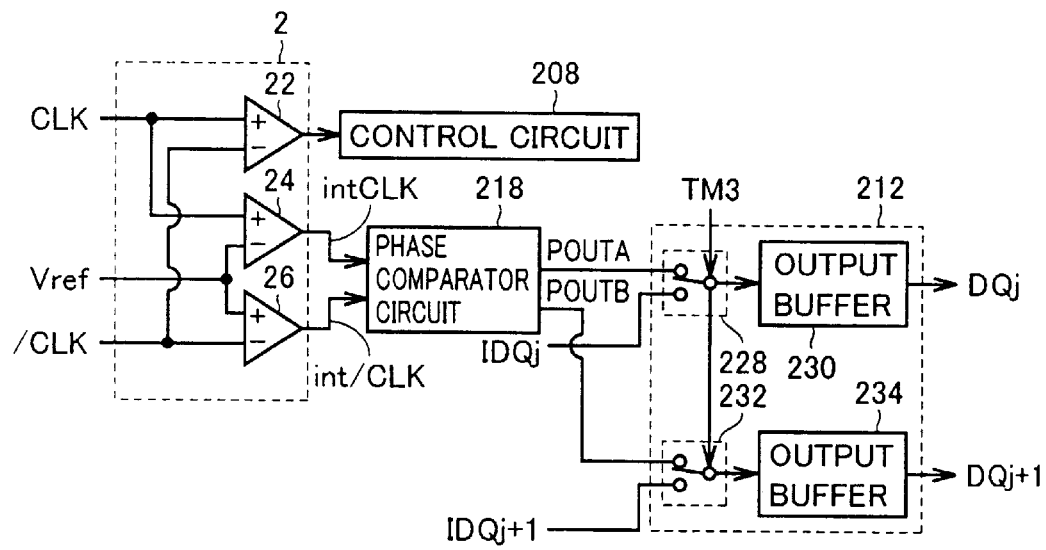
FIG. 8 is a diagram showing a configuration outputting a phase difference in a semiconductor device of a second embodiment.

FIG. 8 is a diagram showing a configuration outputting a phase difference in a semiconductor device of a second embodiment.

A configuration shown in FIG. 8 is such that in the configuration shown in FIG. 2, a phase comparator circuit 218 is included instead of phase comparator circuit 18 and an input buffer 212 is included instead of input/output buffer 12. A configuration of a clock buffer 2 is similar to that shown in FIG. 2 and no description thereof is repeated.

Phase comparator circuit 218 compares internal clock signals intCLK and int/CLK with each other and signals POUTA or POUTB is outputted according to a phase difference between the internal clock signals.

Input/output buffer 212 includes: a switch circuit 228 outputting signal POUTA or internal data signal IDQj outputted from the memory array; an output buffer 230 receiving an output of switch circuit 228 to output data signal DQj to a terminal; a switch circuit 232 outputting signal POUTB or internal data signal IDQj+1; and an output buffer 234 receiving an output of switch circuit 232 to output data signal DQj+1 to a terminal.

Switch circuits 228 and 232 output output signals POUTA and POUTB to respective output buffers 230 and 234 in the test mode in which a test mode signal TM3 is activated. Furthermore, switch circuits 228 and 232 output internal data signals IDQj and IDQj+1 to respective output buffers 230 and 234 in the normal mode in which test mode signal TM3 is deactivated.

Figure 9:
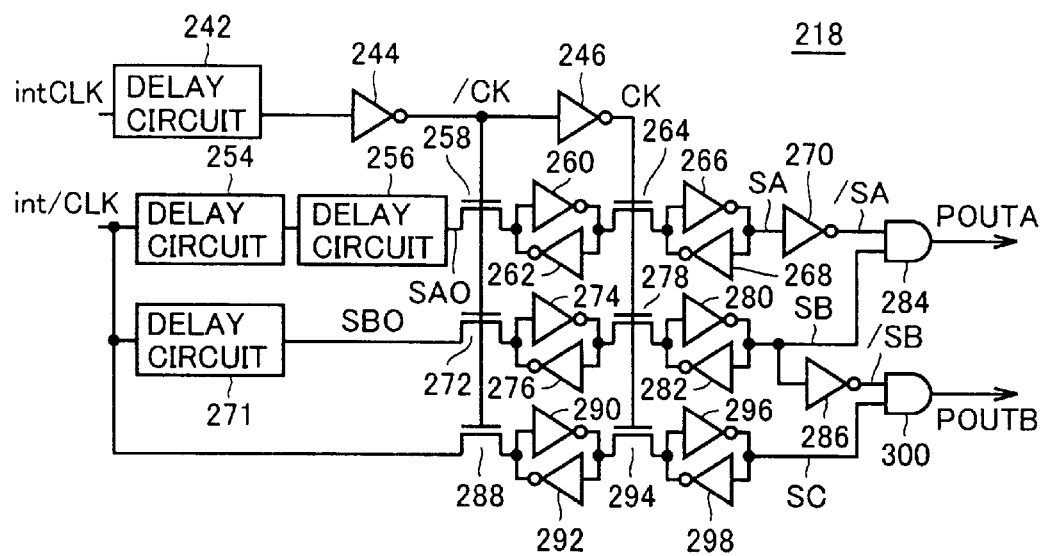
FIG. 9 is a circuit diagram showing a configuration of a phase comparator circuit 218 of FIG. 8.

FIG. 9 is a circuit diagram showing a configuration of phase comparator circuit 218 of FIG. 8.

Referring to FIG. 9, phase comparator circuit 218 includes: a delay circuit 242 delaying internal clock signal intCLK; an inverter 244 receiving and inverting an output of delay circuit 242 to output clock signal /CK; and an inverter 246 receiving and inverting clock signal /CK to output clock signal CK.

Phase comparator circuit 218 further includes: a delay circuit 254 delaying internal clock signal int/CLK; and a delay circuit 256 further delaying an output of delay circuit 254.

Phase comparator circuit 218 further includes: an N channel MOS transistor 258 activated according to clock signal /CK; an inverter 260 receiving and inverting signal SAO when N channel MOS transistor 258 is conducting; and an inverter 262 receiving an output of inverter 260 to feed the output back to the input node of inverter 260.

Phase comparator circuit 218 further includes: an N channel MOS transistor 264 becoming conductive according to clock signal CK; an inverter 266 receiving and inverting an output of inverter 260 to output signal SA when N channel MOS transistor 264 is conducting; an inverter 268 receiving and inverting signal SA to feed the inverted signal back to the input node of inverter 266; and an inverter 270 receiving and inverting signal SA to output signal /SA.

Phase comparator circuit 218 further includes: a delay circuit 271 receiving and delaying internal clock signal int/CLK to output signal SBO; an N channel MOS transistor 272 becoming conductive according to clock signal /CK; an inverter 274 receiving and inverting signal SBO when N channel MOS transistor 272 is conducting; and an inverter 276 receiving an output of inverter 274 to feed the output back to the input node of inverter 274.

Phase comparator circuit 218 further includes: an N channel MOS transistor 278 becoming conductive according to clock signal CK; an inverter 280 receiving and inverting an output of inverter 274 to output signal SB when N channel MOS transistor 278 is conducting; an inverter 282 receiving and inverting signal SB to feed the inverted signal back to the input node of inverter 280; an AND circuit 284 receiving signals /SA and SB to output output signal POUTA; and an inverter 286 receiving and inverting signal SB to output signal /SB.

Phase comparator circuit 218 further includes: an N channel MOS transistor 288 becoming conductive according to clock signal /CK: and inverter 290 receiving and inverting internal clock signal int/CLK when N channel MOS transistor is conducting; an inverter 292 receiving and inverting an output of inverter 290 to feed the inverted output back to the input node of inverter 290; and an N channel MOS transistor 294 becoming conductive according to clock signal CK.

Phase comparator circuit 218 further includes: an inverter 296 receiving and inverting an output of inverter 290 to output signal SC when N channel MOS transistor 294 is conducting; an inverter 298 receiving and inverting signal SC to feed the inverted signal back to the input node of inverter 296; and an AND circuit 300 receiving signals /SB and SC to output output signal POUTB.

Figure 10:
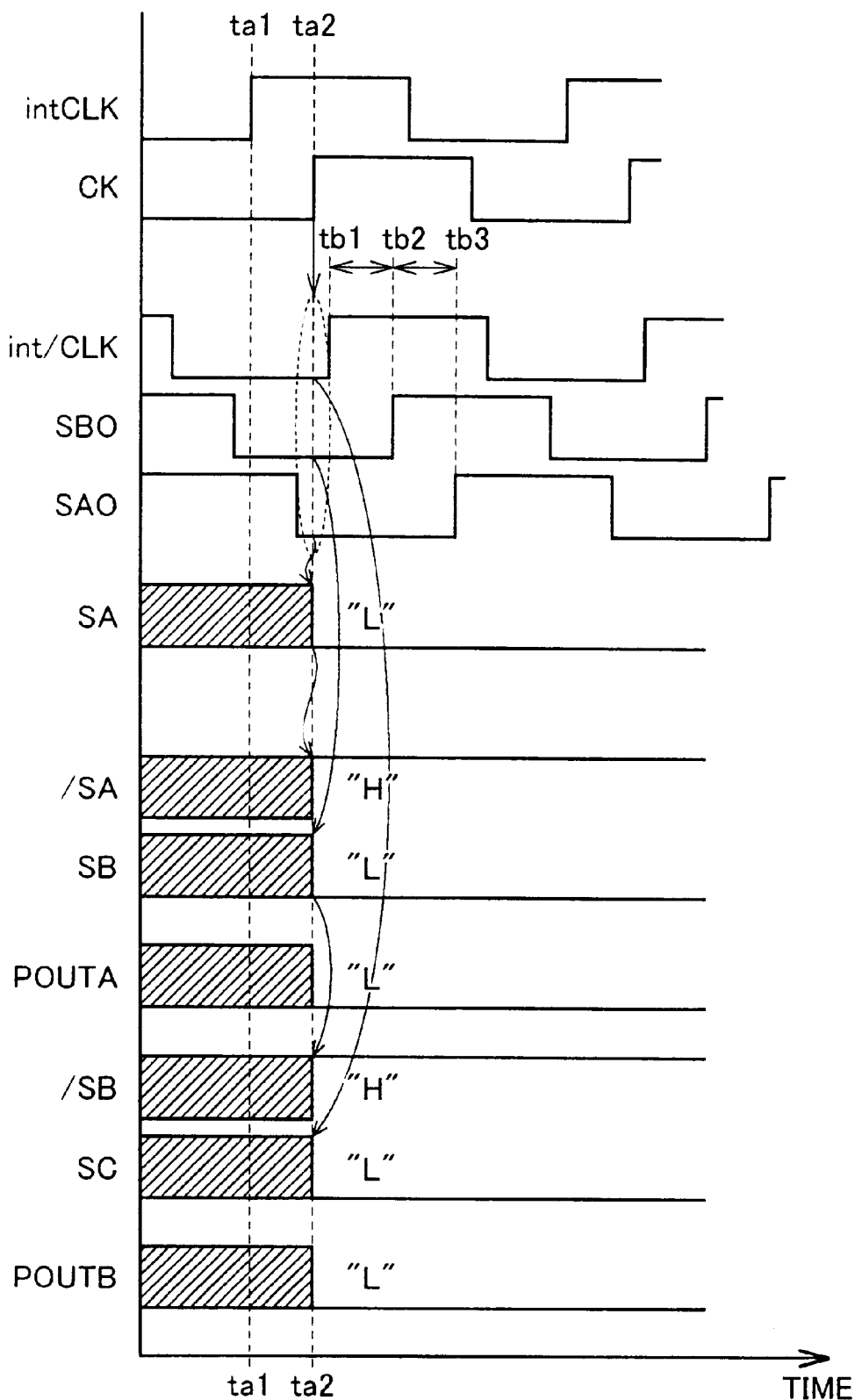
FIG. 10 is a first operating waveform diagram for describing operation of phase comparator circuit 218.

FIG. 10 is a first operating waveform diagram for describing operation of phase comparator circuit 218.

In FIG. 10, a case is shown in which internal clock signal intCLK leads internal clock signal int/CLK in respect to phase. Referring to FIGS. 9 and 10, when internal clock signal intCLK rises at time point ta1, clock signal CK rises from L level to H level at time point ta2 later than time point ta1 by a delay time of delay circuit 242. On the other hand, time point tb1 when internal clock signal int/CLK rises from L level to H level is later than time point ta2.

At time point tb2 later than time point tb1 by a delay time of delay circuit 271, signal SBO rises from L level to H level.

Subsequently, at time point tb3 later than time point tb1 by a delay time of delay circuits 254 and 256 combined, signal SAO rises from L level to H level.

In such a situation, signals SA, SB and SC latched at time point ta2 are all fixed at L level. Therefore, at time point ta2, output signal POUTA is driven to L level by AND circuit 284 receiving signals /SA and SB.

Furthermore, at time point ta2, output signal POUTB is driven to L level by AND circuit 300 receiving signals /SB and SC.

Figure 11:
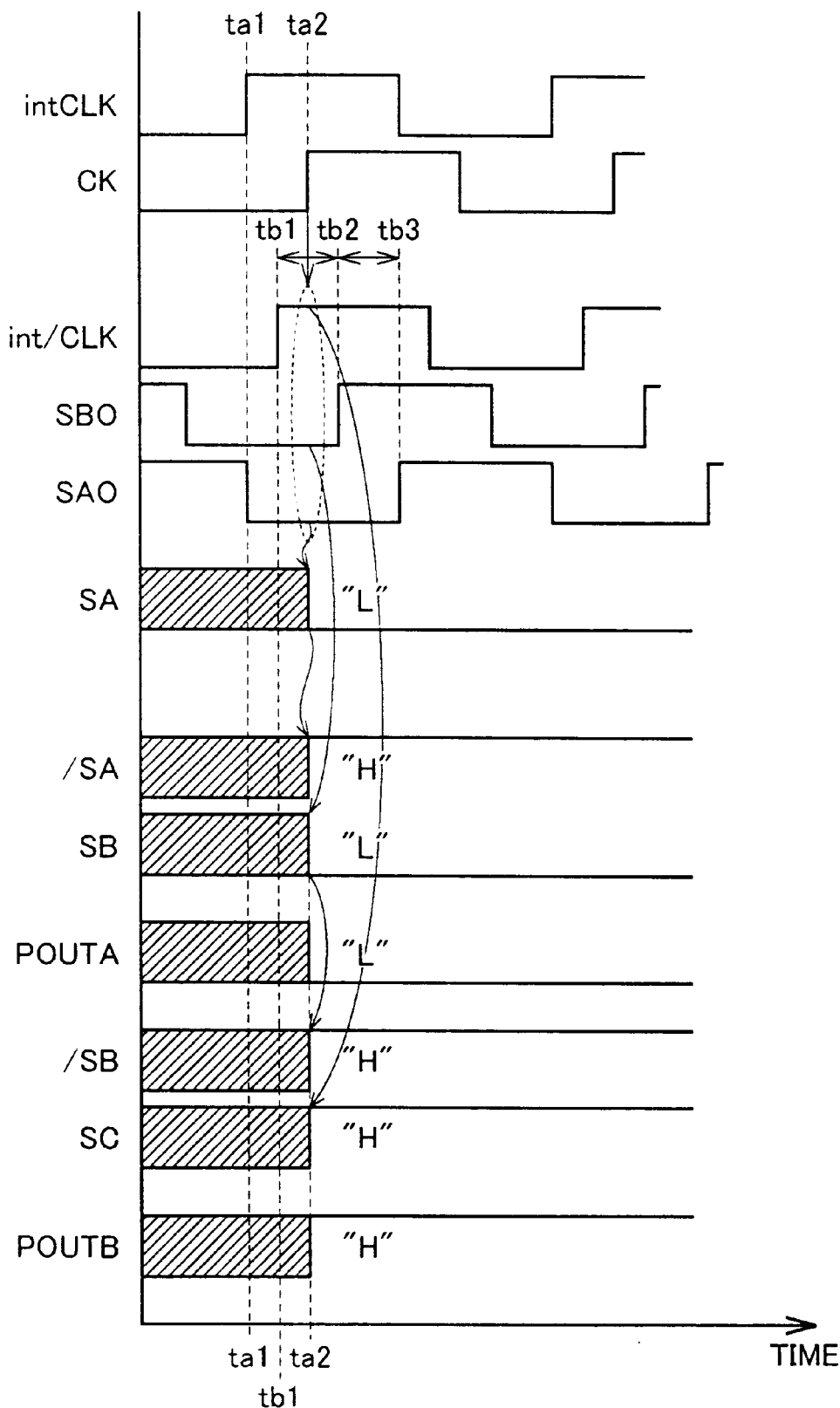
FIG. 11 is a second operating waveform diagram for describing operation of phase comparator circuit 218.

FIG. 11 is a second operating waveform diagram for describing operation of phase comparator circuit 218.

FIG. 11 shows a case where a phase of internal dock signal int/CLK is a little earlier than in the case of FIG. 10.

Referring to FIGS. 9 and 11, time point ta2 is located between time points tb1 and tb2. Therefore, signals SA, SB and SC latched at time point ta2 are fixed at L, L and H levels, respectively.

Accordingly, AND circuit 284 receiving signals /SA and SB outputs output signal POUTA of L level.

On the other hand, AND circuit 300 receiving signals /SB and SC outputs output signal POUTB of H level.

Figure 12:
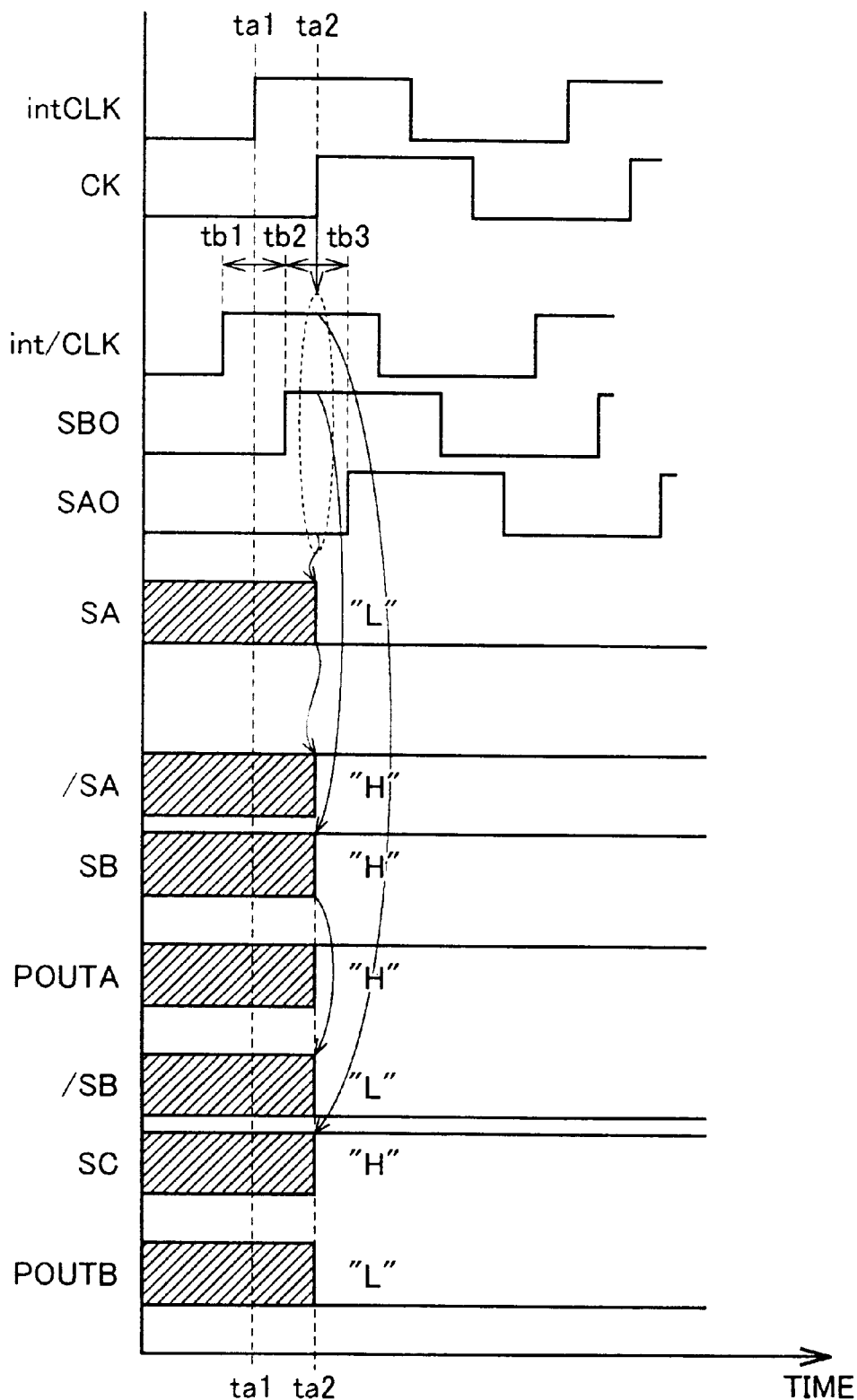
FIG. 12 is a third operating waveform diagram for describing operation of phase comparator circuit 218.

FIG. 12 is a third operating waveform diagram for describing operation of phase comparator circuit 218.

FIG. 12 shows a case where a phase of internal clock int/CLK is further earlier compared with the case of FIG. 11.

Referring to FIGS. 9 and 12, time point ta2 at which phase comparator circuit 218 latches signals SA, SB and SC is located between time points tb2 and tb3. Hence, at time point ta2, signals SA, SB and SC are fixed at L, H and H levels, respectively.

Accordingly, AND circuit 284 receiving signals /SA and SB outputs output signal POUTA of H level. On the other hand, AND circuit 300 receiving signals /SB and SC outputs output signal POUTB of L level.

Figure 13:
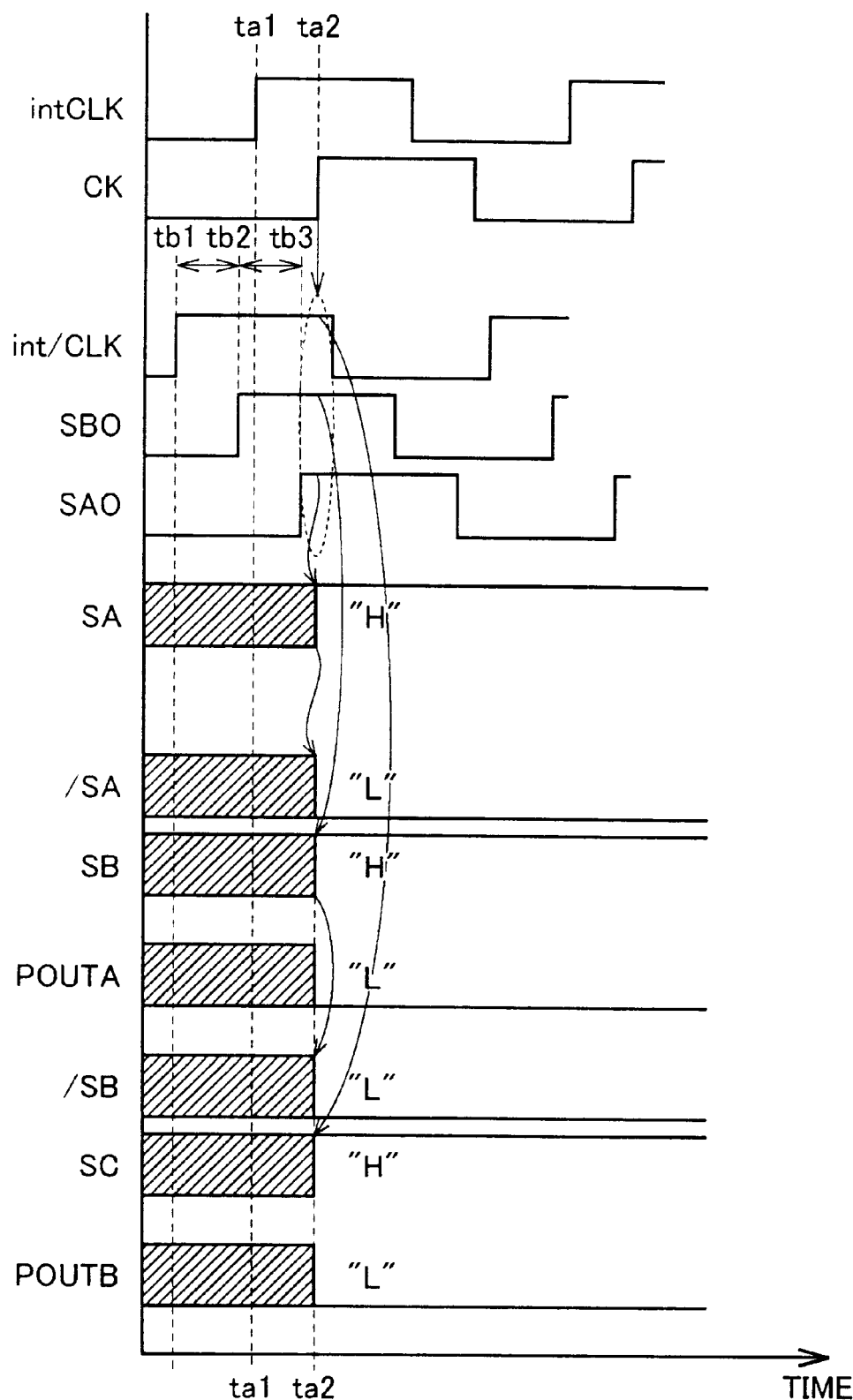
FIG. 13 is a fourth operating waveform diagram for describing operation of phase comparator circuit 218.

FIG. 13 is a fourth operating waveform diagram for describing operation of phase comparator circuit 218.

FIG. 13 shows a case where a phase of internal clock int/CLK is further earlier than in the case of FIG. 12.

Referring to FIGS. 9 and 13, time point ta2 when phase comparator circuit 218 latches signal SA, SB and SC is later than time point tb3. Therefore, at time point ta2, signals SA, SB and SC are all fixed at H level.

In response to this, since AND circuits 284 and 300 both output respective output signals POUTA and POUTB of L level.

As shown above, the semiconductor device of the second embodiment outputs a signal that the phase comparator circuit indicates a phase difference to outside the semiconductor device according to the phase difference. Therefore, once a tester monitors the phase difference, a timing corresponding to the phase difference can be matched. Since a change in timing and confirmation of timing in the test mode by a tester is not required to be repeated many times, calibration can be correctly effected in a short time.

Note that while in FIGS. 8 to 13, description is given of clock signals CLK, this applies to data strobe signals DQS, which are complementary to each other, in a similar manner.

Figure 14:
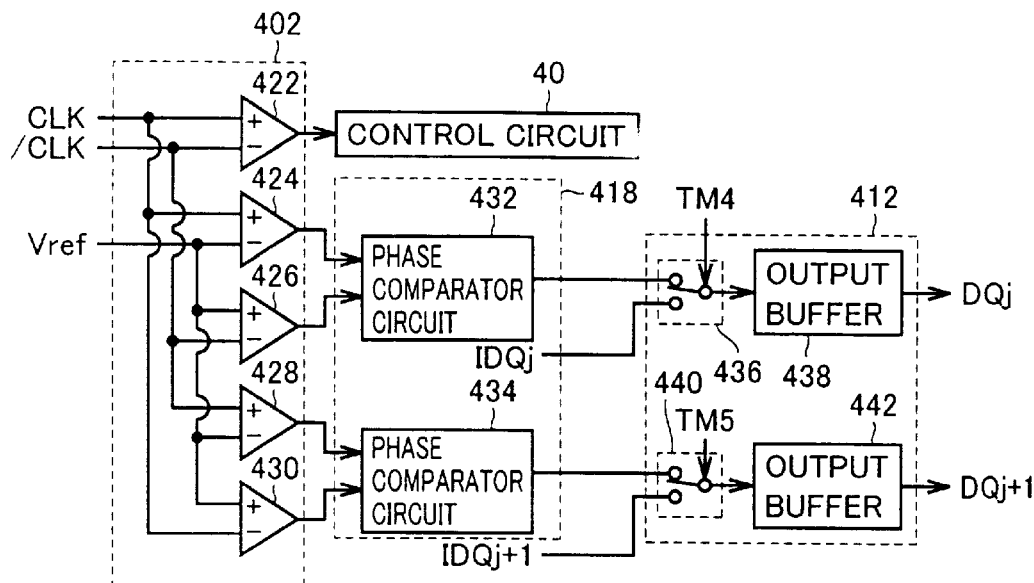
FIG. 14 is a diagram showing a modification example of the second embodiment.

FIG. 14 is a diagram showing a modification example of the second embodiment.

Referring to FIG. 14, a clock buffer 402 includes: a comparator circuit 422 receiving clock signal CLK at the plus input node thereof and clock signal/CLK at the minus input node thereof; a comparator circuit 424 receiving clock signal CLK at the plus input node thereof and reference potential Vref at the minus input node thereof; a comparator circuit 426 receiving reference Vref at the plus input node thereof and clock signal /CLK at the minus input node thereof; a comparator circuit 428 receiving clock signal /CLK at the plus input node thereof and reference potential Vref at the minus input node thereof; and a comparator circuit 430 receiving reference potential Vref at the plus input node and clock signal CLK at the minus input node thereof.

A phase comparator circuit 418 includes a phase comparator circuit 432 receiving outputs of comparator circuits 424 and 426 to compare phases with each other; and a phase comparator circuit 434 receiving outputs of comparator circuits 428 and 430 to compare phases with each other.

An input/output buffer 412 includes: a switch circuit 436 outputting internal data signal IDQj outputted from the memory array or an output of phase comparator circuit 432 according to test mode signal TM4; an output buffer 438 receiving an output of switch circuit 436 to output data signal DQj to a terminal; a switch circuit 440 outputting internal data signal IDQj+1 or an output of phase comparator circuit 434 according to a test mode signal TM5; and an output buffer 442 receiving an output of switch circuit 440 to output data signal DQj+1 to a terminal.

With the configuration shown in FIG. 14 adopted, it is possible that the semiconductor device outputs a shift in respect to phase between a rise edge of clock signal CLK and a fall edge of clock signal CLK and simultaneously with this, outputs a shift in respect to phase between a fall edge of clock signal CLK and a rise edge of clock signal /CLK. Therefore, calibration of rise edges and fall edges of waveforms in the tester can be performed in a short time.

Third Embodiment

While in the first and second embodiments, description is given of complementary signals, clock signals CLK and data strobe signals DQS, there is a case where phase difference between two signals, not complementary to each other, cannot be measured: for example, a shift between clock signal CLK and data strobe signal DQS. In a case of a DDR SDRAM, data is inputted with data strobe signal DQS as a trigger. On the other hand, a command and an address are inputted with clock signal CLK as a trigger. Therefore, no relation arises between data strobe signal DGS and clock signal CLK in respect of phase in operation. That is, even when a standard device having known characteristics is used, matching cannot be achieved on a skew between a driver outputting data strobe signal DQS and a driver outputting clock signal CLK from a tester.

In order to solve this problem, included in a semiconductor device is a circuit outputting a phase difference between two signals in the test mode, similar to the cases shown in the first and second embodiments.

Figure 15:
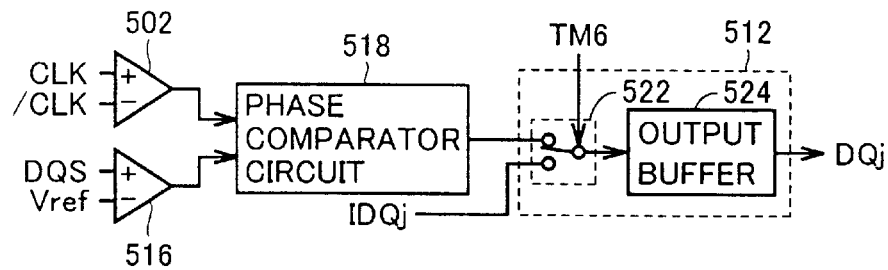
FIG. 15 is a diagram showing a configuration in which a phase difference between two signals is outputted from a semiconductor device in a third embodiment.

FIG. 15 is a diagram showing a configuration in which a phase difference between two signals is outputted from a semiconductor device in a third embodiment.

Referring to FIG. 15, the semiconductor device of the third embodiment includes: a comparator circuit 502 receiving clock signal CLK at the plus input node thereof and clock signal /CLK at the minus input node thereof; a comparator circuit 516 receiving data strobe signal DQS at the plus input node thereof and reference potential Vref at the minus input node thereof; a phase comparator circuit 518 comparing outputs of comparator circuits 502 and 516 with each other; and an input/output buffer 512 outputting an output of phase comparator circuit 518 or internal data signal IDQj as data signal DQj to a terminal.

Input/output buffer 512 includes: a switch circuit 522 outputting an output of phase comparator circuit 518 or, internal data signal IDQj, according to a test mode signal TM6; and an output buffer 524 receiving an output of switch circuit 522 to output data signal DQj to a terminal.

The configuration of phase comparator circuit 518 is similar to that of phase comparator circuit 18 shown in FIG. 3 and no description thereof is repeated.

Note that FIG. 15 shows a case where a single strobe signal is used instead of complementary strobe signals.

Figure 16:
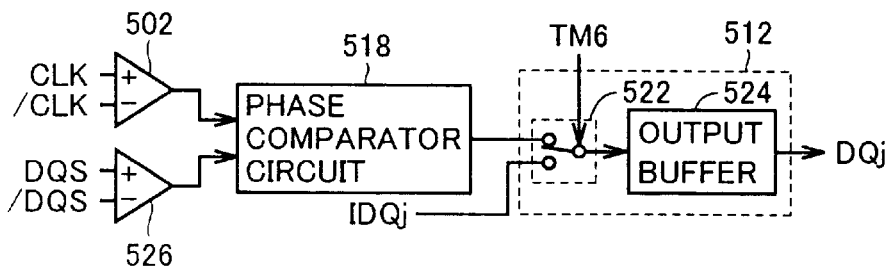
FIG. 16 is a diagram showing a modification example of a case where there are employed strobe signals complementary to each other.

FIG. 16 is a diagram showing a modification example of a case where there are employed strobe signals complementary to each other.

Referring to FIG. 16, the semiconductor device is configured such that in the configuration of the semiconductor device shown in FIG. 15, included instead of comparator circuit 516 is a comparator circuit 526 receiving strobe signal DQS at the plus input node thereof and strobe signal /DQS at the minus input node thereof. The other part of the configuration is similar to the corresponding part of the case shown in FIG. 15 and no description thereof is repeated.

In the configuration shown in FIG. 16, matching on a phase difference between two signals can be possible with ease similar to the case of FIG. 15.

Furthermore, no specific relation in respect to phase arises between clock signal CLK and data signal DQ in operation either. Therefore, the present invention can be applied to clock signal CLK and data signal DQ in a similar manner.

Figure 17:
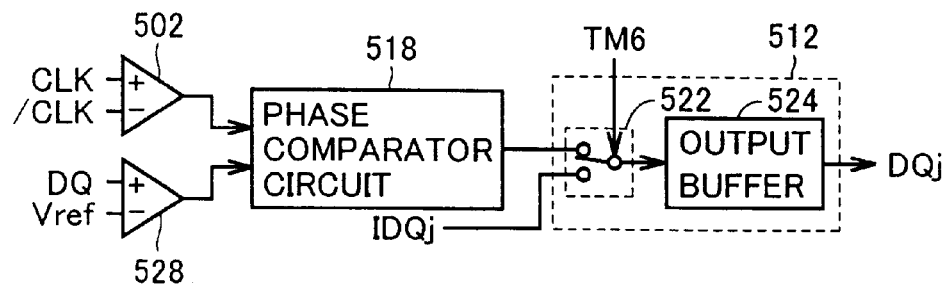
FIG. 17 is a diagram showing a configuration comparing clock signal CLK with data signal DQ in respect to phase.

FIG. 17 is a diagram showing a configuration comparing clock signal CLK with data signal DQ in respect to phase. in the Referring to FIG. 17, the semiconductor device is configured such that in the configuration of the semiconductor device shown in FIG. 15, included instead of comparator circuit 516 is a comparator circuit 528 receiving data signal DQ at the plus input node and reference potential Vref at the minus input node thereof. The other part of the configuration is similar to the corresponding part of the case shown in FIG. 15 and no description thereof is repeated.

As described above, the semiconductor device of the third embodiment is of a configuration in which there is performed comparison of clock signal with other signals, a strobe signal and a data signal, and results of the comparison are outputted to outside the semiconductor device in the test mode, thereby enabling high accuracy calibration of a tester for use in confirmation of operation of the semiconductor device.

Fourth Embodiment

Figure 20:
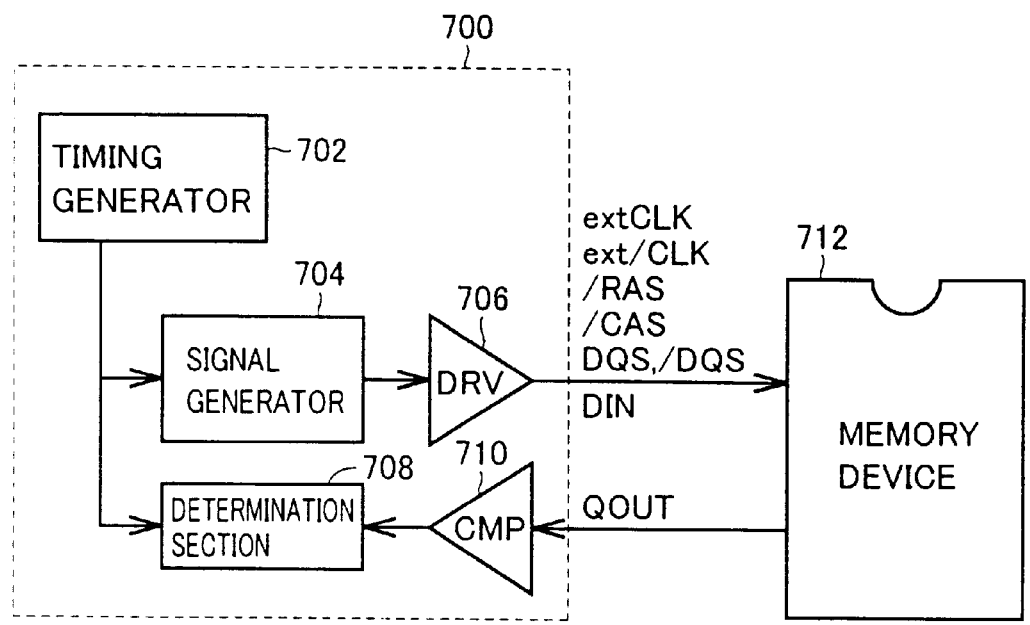
FIG. 20 is a diagram for describing a test for confirming functions of a semiconductor memory device.
Figure 21:
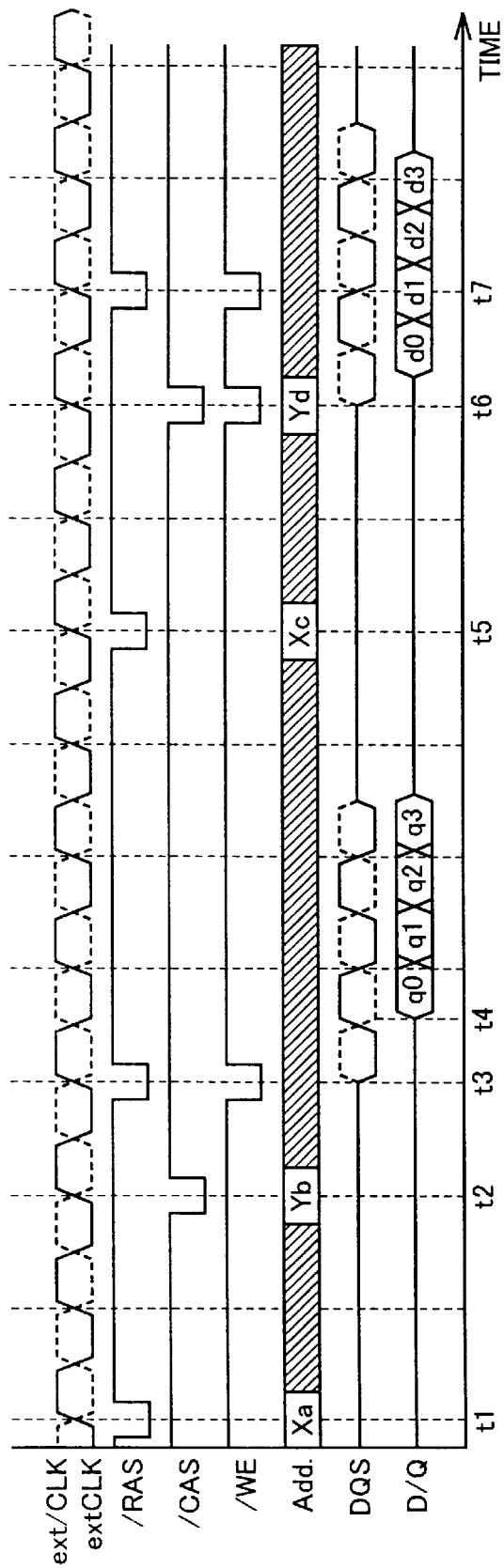
FIG. 21 is an operating waveform diagram for describing input and output waveforms in standardized operation of DDR SDRAM.
Figure 22:
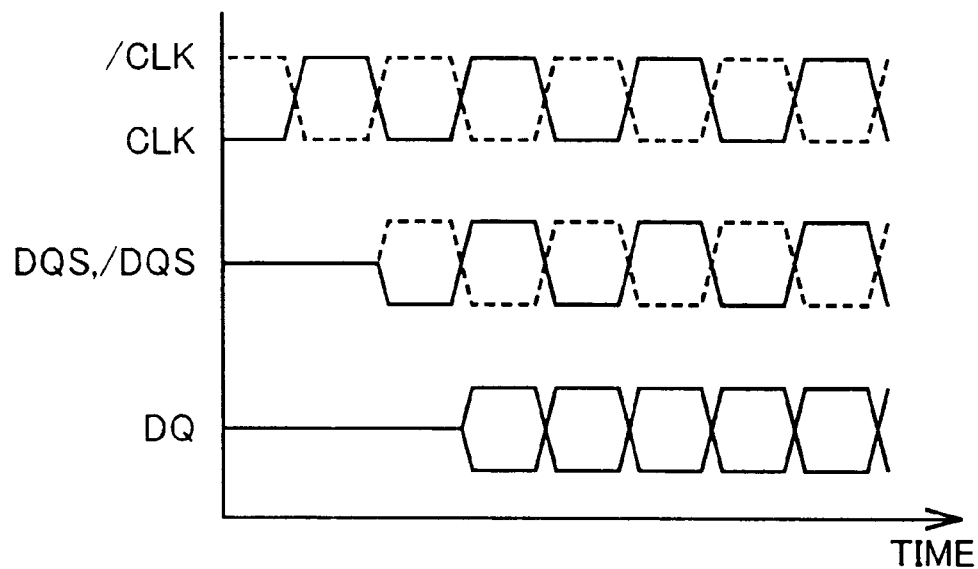
FIG. 22 is an operating waveform diagram showing relationships among clock signals CLK and /CLK, data strobe signals DQS and /DQS and data signal DQ in an ideal case.
Figure 23:
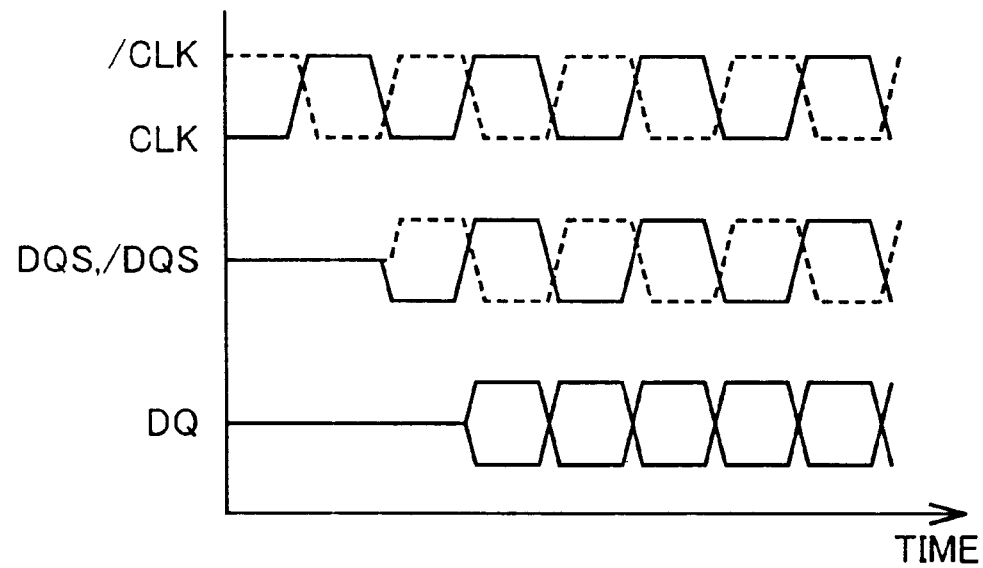
FIG. 23 is an operating waveform diagram for describing a case where there arises a shift between waveforms of complementary signals.

In a tester 700 shown in FIG. 20, a determination timing of a determination section 708 comparing an output of a comparator 710 receiving a data signal with an expected value pattern can be matched by measuring an access time of a standard device which has been measured. However, in a case where there exists a fluctuation in access time of a semiconductor device, the timing cannot be matched with good repeatability.

Conceived as causes for dispersion in access time of a semiconductor device are noise inside the device and a fluctuation in characteristics of a delay locked loop (DLL) circuit. In the fourth embodiment, the semiconductor device is equipped with a DLL circuit 610 capable of suppressing a fluctuation in the test instead of DLL circuit 10 of FIG. 1. With this configuration adopted, there can be performed high accuracy calibration of a comparator in a tester.

Figure 18:
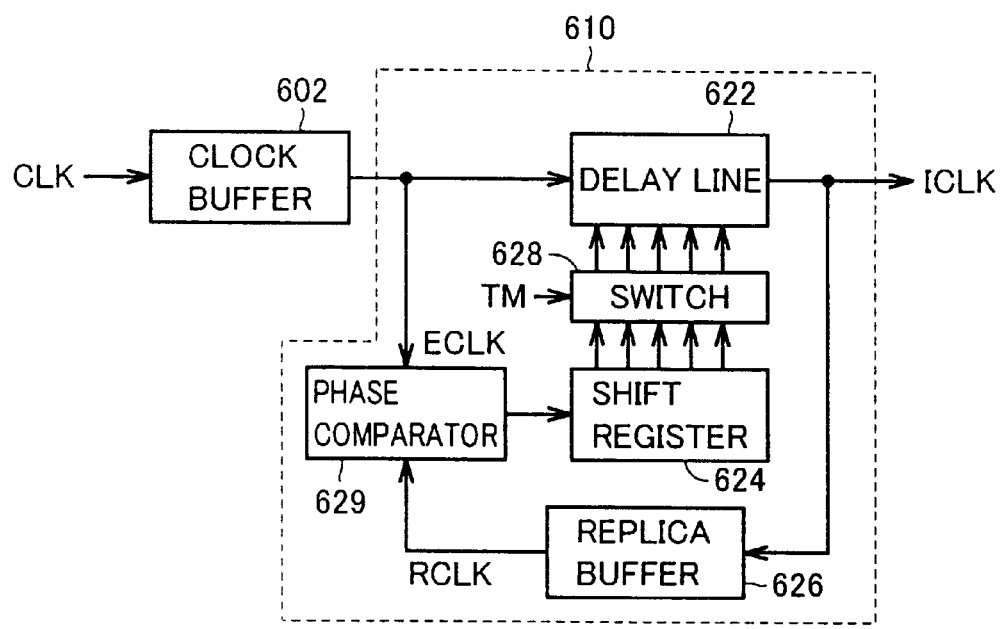
FIG. 18 is a block diagram showing a configuration of a DLL circuit 610 of a semiconductor device of a fourth embodiment.

FIG. 18 is a block diagram showing a configuration of DLL circuit 610 of the semiconductor device of a fourth embodiment.

Referring to FIG. 18, DLL circuit 610 includes: a delay line delaying a signal ECLK, which is an output signal of a clock buffer 602, to output an internal clock signal ICLK; a replica buffer 626 delaying an output of delay line 622 by a time length corresponding to a delay time till the output of clock buffer 602 reaches an internal circuit, not shown, in which internal clock signal ICLK is used; a phase comparator 629 comparing a signal RCLK outputted by replica buffer 626 with signal ECLK in respect to phase to output a control signal; and a shift register 624 for controlling a delay time of delay line 622 according to an output of phase comparator 629.

DLL circuit 610 further includes switch circuitry 628 fixing a control signal given to delay line 622 from shift register 624 according to test mode TM.

Figure 19:
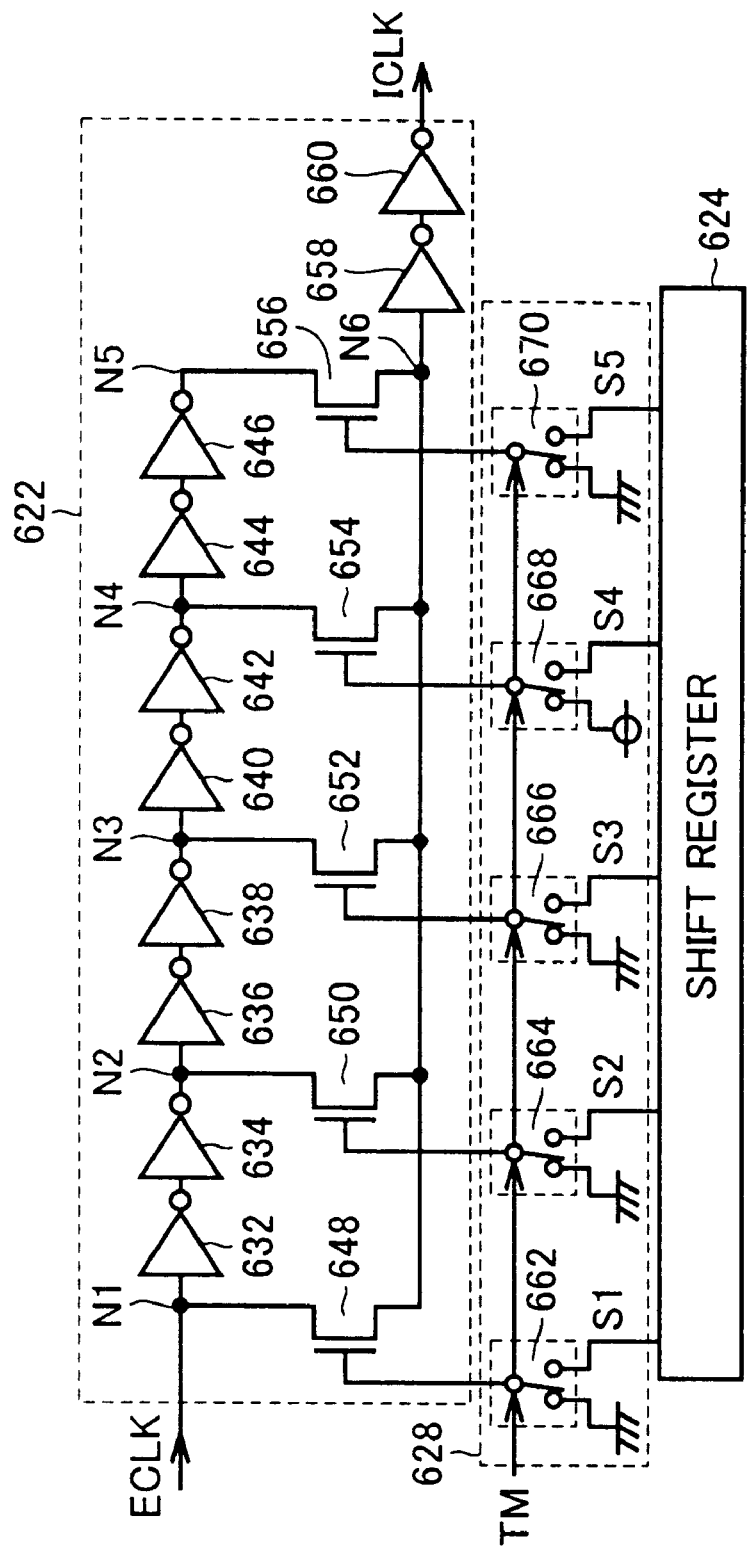
FIG. 19 is a circuit diagram for describing a configuration of a delay line 622 and a switch circuitry 628 combined shown in FIG. 18.

FIG. 19 is a circuit diagram for describing a configuration of delay line 622 and switch circuitry 628 combined shown in FIG. 18.

Referring to FIG. 19, switch circuitry 628 includes: switch circuits 662, 664, 666, 668, and 670 outputting respective signals S1, S2, S3, S4 and S5 outputted by a shift register in the normal mode according to test mode TM. Switch circuits 662, 664, 666, 668 and 670 output signals S1, S2, S3, S4 and S5 of L, L, L, H and L levels, respectively, in the test mode.

Delay line 622 includes: an inverter 632 whose input is connected to a node N1 to which signal ECLK is given; an inverter 634 receiving and inverting an output of inverter 632 to output the inverted output to a node N2; an inverter 636 whose input is connected to node N2; an inverter 638 receiving and inverting an output of inverter 636 to output the inverted output to a node N3; an inverter 640 whose input is connected to node N3;

an inverter 642 receiving an output of inverter 640 to output the inverted output to a node N4; an inverter 644 whose input is connected to node N4; and an inverter 646 receiving and inverting an output of inverter 644 to output the inverted output to a node N5.

Delay line 622 further includes: an N channel MOS transistor 648 connected between nodes N1 and N6 and receiving an output of switch circuit 662 at the gate thereof; an N channel MOS transistor 650 connected between nodes N2 and N6 and receiving an output of switch unit 664 at the gate thereof; an N channel MOS transistor 652 connected between nodes N3 and N6 and receiving an output of switch unit 666 at the gate thereof; an N channel MOS transistor 654 connected between nodes N4 and N6 and receiving an output of switch circuit 668 at the gate thereof; and an N channel MOS transistor 656 connected between nodes N5 and N6 and receiving an output of switch circuit 670 at the gate thereof.

Delay line 622 further includes: an inverter 658 whose input is connected to node N6; and an inverter 660 receiving and inverting an output of inverter 658 to output clock signal ICLK.

In the test mode, fixed values are outputted from switch circuits 662 to 670. Therefore, in the test mode, N channel MOS transistors 648, 650, 652 and 656 are non-conductive, while N channel MOS transistor 654 is conductive. Hence, a delay time of delay line 622 is fixed at an amount in the test mode. With such a fixed delay time, a fluctuation in clock signal ICLK, which is an output signal of a DDL circuit, can be restricted to a small value, thereby enabling a high accuracy calibration to be performed.

Although the present invention has been described and illustrated in detail, it is clearly understood that the same is by way of illustration and example only and is not be taken by way of limitation, the spirit and scope of the present invention being limited only by the terms of the appended claims.

What is claimed is:

1. A semiconductor device with a normal mode and a test mode as operation modes, comprising:

an internal circuit operating according to first and second input signals in said normal mode;

a phase comparator circuit comparing said first and second input signals with each other in respect to phase in said test mode; and an output buffer circuit providing an output of said phase comparator circuit to outside said semiconductor device in said test mode.

2. The semiconductor device according to claim 1, wherein said first and second input signals are externally applied complementary clock signals, and said internal circuit includes a memory array performing supplying and receiving of data according to said first and second input signals.

3. The semiconductor device according to claim 2, further comprising an input circuit receiving said first and second input signals, wherein said input circuit includes
a first differential comparator circuit comparing said first input signal and a reference potential with each other, and
a second differential comparator circuit comparing said second input signal and said reference potential with each other, said phase comparator circuit receives outputs of said first and second differential comparator circuits to compare said first and second input signals at complementary edges thereof.

4. The semiconductor device according to claim 2, wherein said output buffer circuit includes
a switch circuit transmitting an internal data signal outputted from said memory array in said normal mode, while transmitting an output of said phase comparator circuit in said test mode; and
an output circuit outputting a signal transmitted by said switch circuit to outside said semiconductor device.

5. The semiconductor device according to claim 1, wherein
   said first and second input signals are complementary data strobe signals given from outside said semiconductor device and
   said internal circuit includes
      an input/output circuit supplying and receiving data signals to and from outside said semiconductor device according to said first and second input signals; and
      a memory array supplying and receiving said data signals to and from said input/output circuit.

6. The semiconductor device according to claim 1, wherein
   said first input signal is a clock signal given from outside said semiconductor device,
   said second input signal is a data strobe signal given from outside said semiconductor device, and
   said internal circuit includes
      an input/output circuit supplying and receiving data signals to and from outside said semiconductor device according to said second input signals, and
      a memory array supplying and receiving said data signals to and from said input/output circuit and operating according to said first input signal.

7. The semiconductor device according to claim 1, wherein
   said first input signal is a clock signal given from outside said semiconductor device,
   said second input signal is a data signal given from outside said semiconductor device, and
   said internal circuit includes
      an input/output circuit supplying and receiving said data signal, and
      a memory array supplying and receiving said data signal to and from said input/output circuit and operating according to said clock signal.

8. The semiconductor device according to claim 1, wherein
   said phase comparator circuit outputs a phase difference signal of plural bits according to a magnitude of a phase difference between said first input signal and said second input signal, and
   said output buffer circuit includes plural output circuits corresponding to said respective plural bits.

9. The semiconductor device according to claim 1, wherein
   said first and second input signals are input signals complementary to each other;
   said phase comparator circuit includes
      a first phase comparator unit comparing a rise edge of said first input signal and a fall edge of said second input signal with each other in respect to phase, and
      a second phase comparator unit comparing a fall edge of said first input signal and a rise edge of said second input signal with each other in respect to phase; and
   said output buffer circuit includes first and second output circuits receiving outputs of said first and second phase comparator units, respectively.

10. A semiconductor device with a normal mode and a test mode as operation modes, comprising:
   a clock generator circuit outputting an internal clock signal according to an external clock signal, said clock generator circuit delaying said external clock signal by a delay amount corresponding to a phase difference between said internal clock signal and said external clock signal to output said internal clock signal in said normal mode, while delaying said external clock signal by a fixed delay amount to output said internal clock in said test mode; and
   an input/output circuit supplying and receiving signals to and from outside said semiconductor device according to said internal clock signal.

11. The semiconductor device according to claim 10, wherein
   said internal clock generator circuit includes
      a phase comparator circuit comparing said external clock signal and said internal clock signal with each other in respect of phase,
      a shift register circuit adjusting a control value in magnitude according to an output of said phase comparator circuit to output said control value,
      a switch circuit transmitting said control value in said normal mode, while transmitting a value corresponding to a fixed delay amount instead of said control value on to said delay line in said test mode,
      a delay line changing a delay amount according to an output of said switch circuit and outputting said internal clock signal.

* * * * *